United States Patent
Miyashita et al.

(12)

(10) Patent No.: US 6,781,362 B1
(45) Date of Patent: Aug. 24, 2004

(54) ENGINE CONTROL DEVICE HAVING VOLTAGE ADJUSTMENT CIRCUITRY

(75) Inventors: Kimio Miyashita, Hitachinaka (JP); Kunito Nakatsuru, Mito (JP); Masahiro Zaitsu, Hitachinaka (JP); Koichi Ono, Naka (JP)

(73) Assignees: Hitachi, Ltd., Tokyo (JP); Hitachi Car Engineering Co., Ltd., Ibaraki (JP)

( * ) Notice: Subject to any disclaimer, the term of this patent is extended or adjusted under 35 U.S.C. 154(b) by 0 days.

(21) Appl. No.: 09/636,029

(22) Filed: Aug. 11, 2000

(30) Foreign Application Priority Data

Aug. 12, 1999 (JP) .......................................... 11-228444

(51) Int. Cl.[7] .............................................. G01R 31/00
(52) U.S. Cl. .................................. 324/158.1; 324/73.1
(58) Field of Search ................................ 324/690, 691, 324/480, 707, 158.1, 765, 760, 73.1; 701/22, 23, 24

(56) References Cited

U.S. PATENT DOCUMENTS

| | | | | |
|---|---|---|---|---|
| 5,146,172 A | * | 9/1992 | Mehr-Ayin et al. | 324/691 |
| 5,200,696 A | * | 4/1993 | Menis et al. | 324/158.1 |
| 5,339,028 A | * | 8/1994 | Ovens et al. | 324/158 |
| 5,393,991 A | * | 2/1995 | Kawakami | 257/48 |
| 5,731,707 A | * | 3/1998 | Andermo | 324/660 |
| 5,825,193 A | | 10/1998 | Nakata et al. | 324/763 |
| 5,999,007 A | * | 12/1999 | Kimura | 324/760 |
| 6,125,309 A | * | 9/2000 | Fujimoto | 701/1 |
| 6,255,839 B1 | * | 7/2001 | Hashimoto | 324/765 |

FOREIGN PATENT DOCUMENTS

| | | |
|---|---|---|
| JP | 7-287603 | 10/1995 |
| JP | 9-304481 | 11/1997 |
| JP | 10-9041 | 1/1998 |

* cited by examiner

*Primary Examiner*—Vinh P. Nguyen
(74) *Attorney, Agent, or Firm*—Crowell & Moring LLP

(57) ABSTRACT

In order to provide an output voltage adjustment circuit which is able to perform the screening of the semiconductor integrated circuit mounted as the bear chip status on the circuit board, and to plan reduction of the mounting area size and improvement of the electrical characteristic nature and reduction of the manufacturing cost by a simple constitution thereof, an engine control device having a control device of the integrated circuit of the arithmetic processing unit for operating the control program, is provided, and said engine control device has an output voltage adjustment circuitry to switch the rated voltage to screen the integrated circuit, and said output voltage adjustment circuitry has plural resistors between the output side power line of the rated voltage and the gland sides.

3 Claims, 4 Drawing Sheets

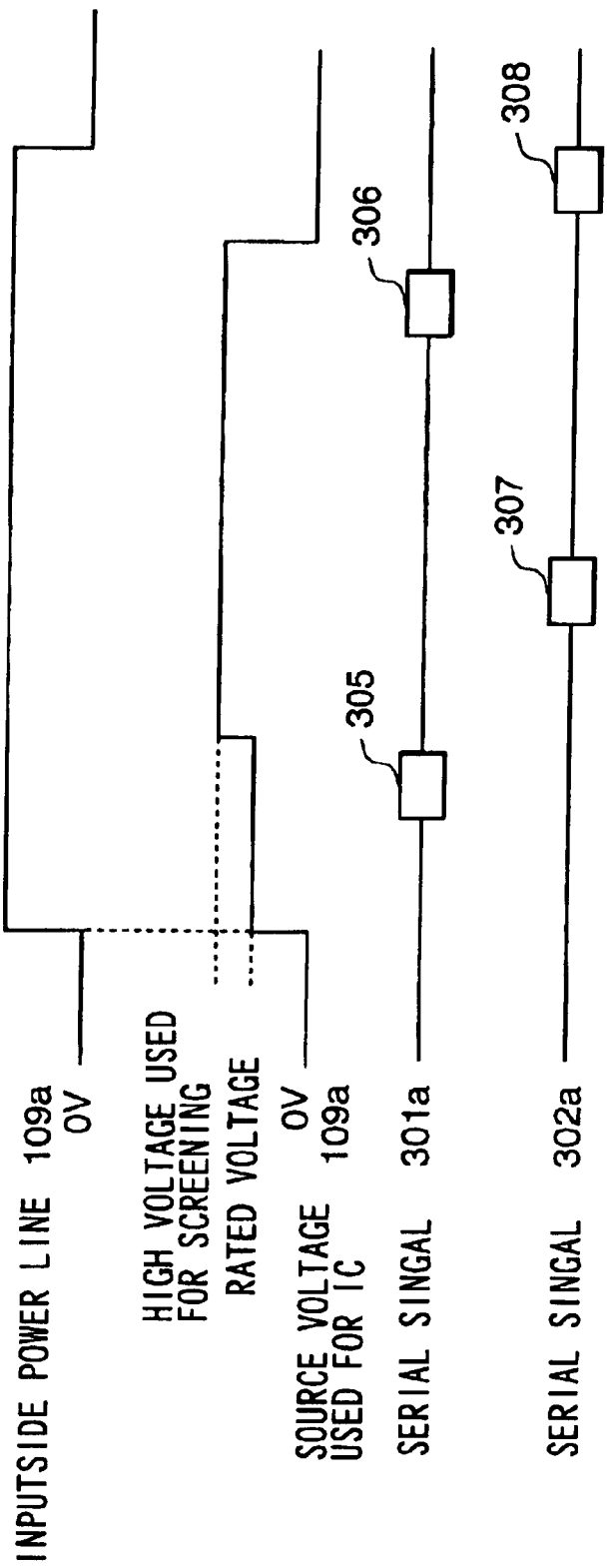

US 6,781,362 B1

ENGINE CONTROL DEVICE HAVING VOLTAGE ADJUSTMENT CIRCUITRY

BACKGROUND OF THE INVENTION

This application claims the priority of Japanese patent document 11-228444, filed 12 Aug. 1999, the disclosure of which is expressly incorporated by reference herein.

The present invention relates to an engine control device, and especially relates to an engine control device for screening an integrated circuit implemented in a circuit board.

Conventionally in a semiconductor integrated circuit for an engine control device of a vehicle, a chip which is cut out from a wafer is screened after having been protected by a package; and after any initial failure in the form of a latent defect is removed from the integrated circuit, the chip is mounted on a circuit board.

Recently, in semiconductor integrated circuits the integrated circuit is mounted on a circuit board in bare chip form (without using the package), in order to reduce mounting size or area, to improve electrical characteristics, and to achieve reduction of manufacturing cost.

In this case, it is not efficient (a lot of time is needed) to individually screen each integrated circuit which is in bare chip form before mounting it on the circuit board, and it is expected to screen the integrated circuit after mounting it.

In the conventional equipment for screening an integrated circuit in bare chip form on a circuit board, a voltage regulator is provided in the circuit board. When a voltage changeover signal is generated by a communication signal from an outside communications means, the voltage occurring in the resistor is amplified to a high voltage (burn-in voltage) by amplifier circuitry, and screening is performed by adding such high voltage in the integrated circuit. (For example, Japanese Patent Laid-open No. 09-304481 and 10-009041 are referred to).

In Japanese Patent Laid-open No. 09-304481 bulletin, it is disclosed to screen by adding a burn-in voltage on the integrated circuit after mounting it, wherein the conventional equipment needs a voltage supervisory circuit and a communications means other than a voltage regulator having a resistor, an amplifier, etc. Thus, the constitution thereof becomes complicated, and no attention is given to reduction of manufacturing cost by reducing the number of components and the number of production steps as a characteristic feature, to mount the chip on the circuit board in bare chip form.

Furthermore, in a technique disclosed in Japanese Patent Laid-open No. 10-009041 bulletin, although no external communications means external is needed. Constitution of the voltage regulator and said voltage supervisory circuit are the same. Moreover, Japanese Patent Laid-open No. 09-304481 bulletin does not disclose anything relating to the reduction of the manufacturing cost.

SUMMARY OF THE INVENTION

Based on the above prior art, one object of the present invention is to provide an engine control device having a voltage adjustment which includes screening of a semiconductor integrated circuit mounted on a circuit board in bare chip form (so as to reduce a mounting area thereof).

Another object of the invention is to improve electric characteristics of such an engine control device and reduce its manufacturing cost by providing a simple constitution.

In order to achieve the above-stated object, an engine control device according to the present invention comprises an integrated circuit (such as an arithmetic processing unit etc.) for processing operation of control programs, and an output voltage adjustment circuitry to switch a rated voltage to screen said integrated circuit. According to the invention, the output voltage adjustment circuit comprises plural resistors provided between an output side power line (or the rated voltage) and ground.

Furthermore, according to the present invention the engine control device adds a voltage which is greater than that in normal operation on the integrated circuit when screening said integrated circuit. The output voltage adjustment circuitry is connected to another resistor connected to ground and a connecting point between the plural resistors is connected to the other resistor, and is connected to the constant voltage source circuitry which outputs the rated voltage to the integrated circuit.

The engine control device of the present invention constituted as stated above comprises output voltage adjustment circuitry to switch the rated voltage to screen the integrated circuit, the output voltage adjustment circuitry being constituted with three resistors at least. Accordingly, all integrated circuits can be screened after being mounted, by a low cost constitution without complicated circuitry; and it becomes possible to reduce manufacturing cost and to save time of screening.

Furthermore, in the engine control device of the present invention the other resistor is connected with ground by switching on/off.

Furthermore, in the engine control device of the present invention the other resistor is provided externally to said engine control device, or is connected to a connecting point between said plural resistors through a non-used terminal of said engine control device.

Furthermore, in the engine control device of the present invention the other resistor is internal to said engine control device, or switches on/off based on a serial communication signal.

Furthermore, in the engine control device of the present invention, the arithmetic processing unit has a storage device to be capable of rewriting said control program by said serial communication signal so as to switch on/off, or the arithmetic processing unit has a control program to switch over said rated voltage by said serial communication signal so as to switch on/off.

In the engine control device of the present invention constituted as above, as the program is rewritten with the serial communication signal or is constituted to be switched, all integrated can be screened after being mounted even when no unused terminal is provided.

Furthermore, the control device according to the present invention comprises an integrated circuit such as an arithmetic processing unit etc. for processing operation of control programs, an output voltage adjustment means to switch a rated voltage to screen integrated circuit, and a check means to examine characteristics of said arithmetic processing unit and said integrated circuit.

Other objects, advantages and novel features of the present invention will become apparent from the following detailed description of the invention when considered in conjunction with the accompanying drawings.

BRIEF DESCRIPTION OF THE DRAWINGS

FIG. 4 is a timing chart which explains operation of the engine control device shown in FIG. 3.

DETAILED DESCRIPTION OF THE PREFERRED EMBODIMENT

One embodiment of the engine control device in the present invention will be explained in detail using figures as follows.

Figure 1:
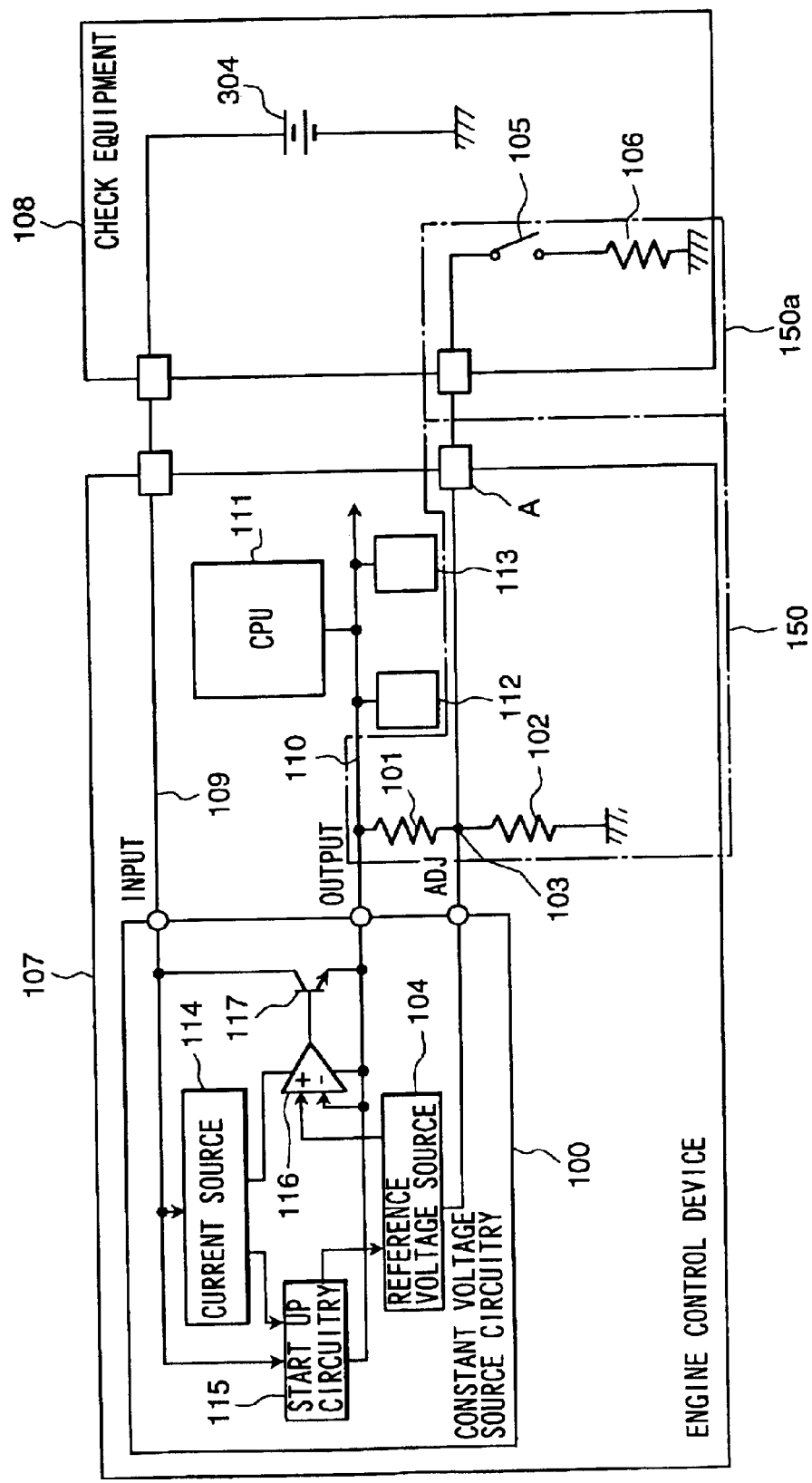
FIG. 1 is a block diagram of an engine control device according to a first embodiment of the present invention.

FIG. 1 is a block diagram to show a first embodiment of the engine control device.

An engine control device 107 includes a constant voltage source circuitry 100, an arithmetic processing unit (CPU) 111, and an integrated circuit (IC) 112, 113 etc. such as the CPU etc. and the CPU 111 and the integrated circuit 112, 113 are mounted on a circuit board in bare chip form.

The engine control device 107 receives a signal from a crank angle sensor (not shown), and processes based on detecting signals, so as to output a driving signal to fuel injection valves (not shown) and an ignition driving signal to a spark plug (not shown). The engine control device 107 includes an input circuit, an AD converter part, and a storage device ROM (not shown). The input circuit takes in an input signal (for example, signals from a coolant temperature sensor, a crank angle sensor, and an air fuel ratio sensor etc.), removes noise components, and supplies the input signal to an AD converter part, which converts it and outputs it to the CPU 111. The CPU 111 takes in the signal converted by the AD conversion and executes a predetermined control program stored in the ROM, and functions to execute control of the device. Further, the operation result and the AD conversion result are stored temporarily in the RAM, and the operation result is output as a control output signal through the output circuit to be used to control the fuel injection valves.

The engine control device 107 is connected with a check equipment (a screening equipment) 108 through a connector in order to screen the CPU 111 and the integrated circuits 112, 113. Thereafter, characteristics of the CPU 111 and the integrated circuits 112, 113 are checked for failures thereof. After they are separated from the check instrument 108, only a good device is provided to an actual machine as the engine control device 107.

The check instrument 108 supplies the battery voltage 304 to a constant voltage source circuitry 100 of the engine control device 107 through an input side power line 109, thereby connecting the constant voltage source circuit 100 with an output voltage adjustment circuitry 150, which switches the rated voltage so as to screen the integrated circuits 112, 113.

The constant voltage source circuitry 100 is a variable output type one and includes a current source 114, a reference voltage source 104, a start up circuitry 115, an error amplifier 116, and a transistor 117. It outputs a constant rated voltage (for example, 5V) to the CPU 111 and the integrated circuits 112, 113 through the output side power line 110.

The output voltage adjustment circuitry 150 switches the rated voltage as stated above, so as to screen the CPU 111 and the integrated circuits 112, 113. It includes resistors 101, 102, 106 and an electric switch 105, the resistors 101 and 102 being connected in series between the output side power line 110 of the rated voltage and ground. On the other hand, the other resistor 106, separate from the resistors 101, 102, is provided in an other output voltage adjustment circuitry 150a inside of the check equipment 108; one end thereof is connected to ground through the electric switch 105, and another end thereof is connected with a connecting point 103 between the resistors 101, 102. It is connected with the resistor 102 in parallel by turning the electric switch 105 on.

In addition, the other resistor 106 is connected with the connecting point 103 between the resistors 101, 102 through a non-used terminal of the engine control device 107, and is simultaneously connected with a reference voltage source 104 of the constant voltage source circuitry 100.

The screening for the CPU 111 and the integrated circuits 112, 113 is performed as follows.

At first, the battery voltage 304 is supplied to the engine control device 107 by the check equipment 108 through the input side power line 109; and the constant voltage source circuitry 100 supplies a source voltage of the usual constant rated voltage (for example, 5V) to the CPU 111 and the integrated circuits 112, 113 through output side power line 110. As a result, the CPU 111 and the integrated circuits 112, 113 start to operate.

The voltage value at the connecting point 103 in normal operation (intermediate voltage value) is determined according to a ratio of the resistors 101 and 102 connected in series, and the constant rated voltage is maintained by comparing the intermediate voltage value with a voltage value of the reference voltage source 104 with the error amplifier 116.

During screening, the voltage at connecting point 103 (intermediate voltage value) is determined to be switched according to a ratio of the resistors 102 and 106 connected in parallel and the resistor 101 connected therewith in series, by turning the electric switch 105 of the output voltage adjustment circuitry 150, and a voltage value which is higher than that in normal operation is supplied to the CPU 111 and the integrated circuit 112, 113 through the output side power line 110 so as to screen them.

After finishing the screening, the electric switch 105 is turned off, and the characteristic of the device is tested with the check equipment 108 at a predetermined time thereafter, any initial failures (being a potential defect of the CPU 111 and the integrated circuit 112, 113) are removed by checking the function of the engine control device 107.

Figure 2:
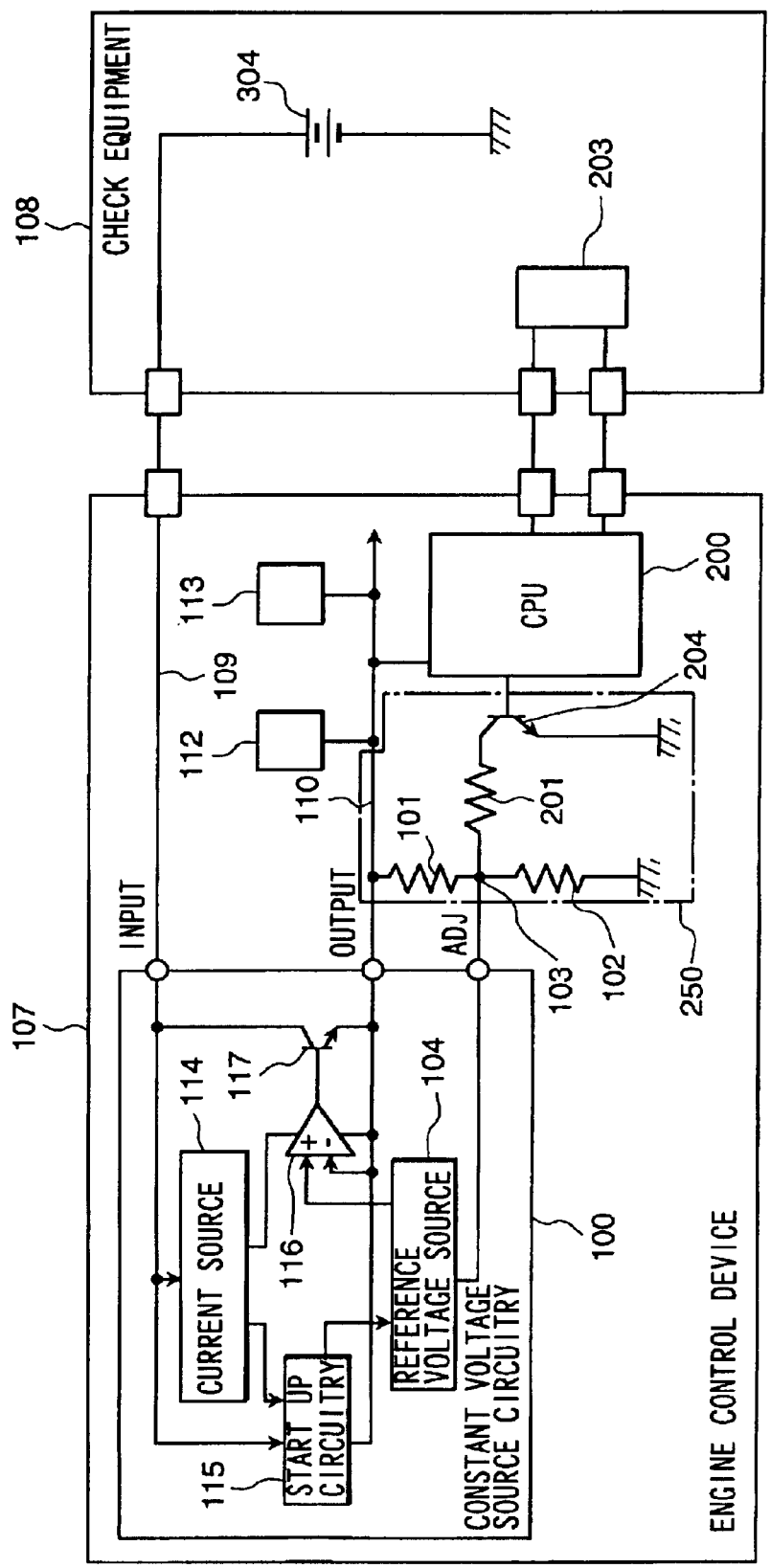
FIG. 2 is a block diagram of an engine control device according to a second embodiment of the present invention.

FIG. 2 is a block diagram which shows a second embodiment of the engine control device according to the invention. As FIG. 2 shows the same construction as FIG. 1, other than a CPU 200 and an output voltage adjustment circuitry 250, only the CPU 200 and the output voltage adjustment circuitry 250 will be explained in detail.

Said CPU 200 builts in a ROM (a flash ROM) which is capable of rewriting the control program and controls the intermediate voltage of the connecting point 103 by the rewritten control program. The output voltage adjustment circuitry 250 is used to switch the rated voltage in order to screen the integrated circuit 112, 113 and is constructed with the resistors 101, 102, 201 and the transistor 204, and the resistor 101 and the resistor 102 are connected in series between the output side power line 110 of the rated voltage and the gland side. On the other hand, the other resistor 201 to be different from the resistors 101, 102, is provided inside of the engine control device 107; one end thereof is connected with ground via the transistor 204 and another end thereof is connected with the connecting point 103 between the resistors 101, 102, and it is connected with the resistor 102 in parallel by turning the electric switch 204 on.

In addition, a serial communication means 203 is arranged external to the engine control device 107. The CPU 200 is switched into a write mode by the output signal and the control program from the serial communication means 203, and simultaneously the control program of the flash ROM in the CPU 200 is rewritten.

In normal operation, by using the serial communication means 203, a program to fix output of a port 202 of the CPU 200 to be a low level is written in the flash ROM and the transistor 204 is turned off.

The intermediate voltage value is determined by the ratio of the resistors 101 and 102 connected in series.

On the other hand, when screening, a program to set the output of the port 202 of the CPU 200 at a high level is written in the flash to be rewritten by the serial communication means 203. The serial communication means 203 turns on the transistor 204 and determines the voltage at the connecting point 103 (intermediate voltage value) so as to switch it based on a ratio of the resistors 102 and 106 connected in parallel and the resistor 101 connected in series therewith. A voltage which is higher than that in normal operation is supplied to the CPU 200 and the integrated circuit 112, 113 through the output side power line 110 so as to screen thereof.

After completion of screening, the program to set the output at the port 202 to a low level again is rewritten on the flash ROM by a serial communication means 203. As a result, the transistor 204 is turned off and characteristics of the device are checked by the check equipment 108 at a predetermined time thereafter. Initial failures (a potential defect of the CPU 200 and the integrated circuit 112, 113) are then removed by checking the function of the engine control device 107.

Figure 3:
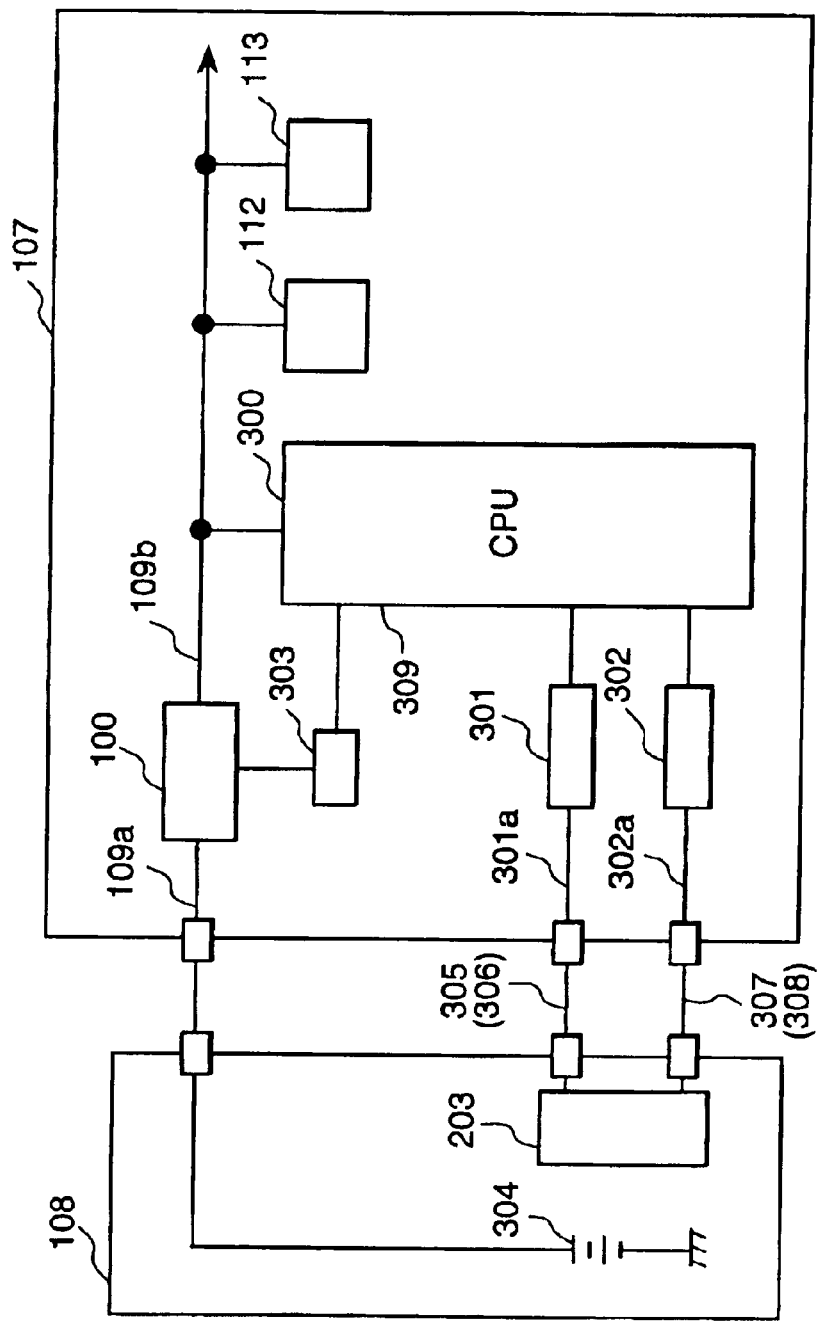
FIG. 3 is a block diagram of an engine control device according to a third embodiment of the present invention.

FIG. 3 is a block diagram which shows a third embodiment of the engine control device according to the invention. As FIG. 3 shows the same construction as FIG. 2 other than the CPU 300, only the CPU 300 will be explained in detail.

The CPU 300 contains the control program to switch a program to set the output at port 309 to a low level, and a program to set the output at port 309 to a high level mutually, so as to control the intermediate voltage of the connecting point 103.

The output voltage adjustment circuitry 303 is constituted in the same way as output voltage adjustment circuitry 250 shown in FIG. 2. It includes the resistors 101, 102 and 201 and the transistor 204, and switches the rated voltage in order to screen the integrated circuits 112, 113.

The resistors 101 and 102 are connected in series between the output side power line 109b of the rated voltage and ground. The one end of the other resistor 201 is connected to ground through the transistor 204, and the other end of the resistor 201 is connected with the connecting point 103 between the resistors 101, 102 and is connected with the resistor 102 in parallel by turning the transistor 204 on.

In normal operation, a program to set the output of the port 309 of the CPU 300 to a low level is designated by the serial communication means 203 so as to turn the transistor 204 off on the other hand, during screening, a program to set the output of the port 309 of the CPU 300 to a high level is designated by the serial communication means 203 so as to turn the transistor 204 on, and a voltage value which is higher than in normal operation is supplied to the CPU 300 and to the integrated circuits 112, 113 through the output side power line 110 so as to screen them. After the screening is completed, the program to fix the output of the port 309 to be the low level is designated, the transistor 204 is turned off, and after the predetermined time has passed, the characteristic of the device is checked by the check equipment 108. Initial failures (potential defects of the integrated circuits 112, 113) are removed by checking the function of the engine control device 107.

FIG. 4 is a timing chart of operating of the engine control device shown by FIG. 3.

At first, the battery voltage 304 is applied to engine control device 107 through the input side power line 109a by using the check equipment (a screening test device) 108, and the constant voltage source circuitry 100 supplies a source voltage having the constant rated voltage (for example, 5V) in normal operation to the CPU 300 and the integrated circuit 112, 113 through the output side power line 109b so as to start to operate the CPU 300 and the integrated circuit 112, 113.

Next, when a high voltage switching designation is transmitted to the communication line 301a from the serial communication means 203 of the check equipment 108, the CPU 300 receives the high voltage switching designation signal 305 through the serial receiver circuit 301, the high voltage switching designation signal 305 is output by the output voltage adjustment circuitry 303 so as to turn the transistor 204 on, and the output voltage value of the constant voltage source circuitry 100 is changed to a high voltage value (7V, for example) for screening.

In addition, the CPU 300 transmits a changeover completion signal 307 to the communication line 302a through a serial transmitting circuit 302 and the signal 307 is returned to the check equipment 108.

Then, after having applied the high voltage in the predetermined time that is necessary for the screening, when the rated voltage switchover designation is transmitted to the communication line 301a from the serial communication circuitry 203 of the check equipment 108, the CPU 300 receives the rated voltage changeover designation signal 306 through the serial receiver circuit 301. The rated voltage changeover designation signal 306 is output to the output voltage adjustment circuitry 303, the transistor 204 is turned off, and the output voltage value of the constant voltage source circuitry 100 is changed to the rated voltage (5V, for example).

In addition, the CPU 300 transmits the changeover completion signal 308 to the communication line 302a through the serial transmitting circuit 302, and the signal 308 is returned to the check equipment 108.

Then, after the predetermined time is passed following completion of the screening, the characteristic of the device is tested by the check equipment 108, and the initial failures (potential defects of the integrated circuits 112, 113) are judged by checking the function of the engine control device 107.

As stated above, the embodiment configuration in the present invention has the following function based on the construction mentioned above.

The engine control device 107 according to the first embodiment of the present invention comprises the CPU 111 to operate the program, integrated circuits 112, 113, the ROM to store the program, the constant voltage source circuitry 100 to output the rated voltage to the integrated circuits 112, 113 etc. and the output voltage adjustment circuitry 150 to switch the rated voltage in order to screen the integrated circuits 112, 113 mounted on the circuit board.

The output voltage adjustment circuitry 150 is connected to other output voltage adjustment circuitry 150a so as to connect the resistors 101, 102, 106 with the electric switch 105. The resistors 101 and 102 are connected in series between the output side power line 110 of the rated voltage and ground. One end of the other resistor 106 is connected to ground and other end thereof is connected to the connecting point 103 of the resistors 101, 102. Moreover, the other resistor 106 is connected in parallel with the resistor 102 by turning the electric switch 105 on; and the reference voltage source 104 of the constant voltage source circuitry 100 is connected with the connecting point 103 between the resistors 101, 102 through the non-used terminal A of the engine control device 107. Therefore, the screening of all integrated circuits 112, 113 (after being mounted) can be performed by changing the intermediate voltage of connecting point 103, without providing complicated circuitry and the outside output signal means especially, thereby reducing the manufacturing cost and shortening of the time of the screening.

Furthermore, in the above embodiment, the voltage value is changed for the screening, and the reduction of the power consumption can be planned by using the change of this voltage value for engine control. In the engine control device 107 in the second embodiment, the CPU 200 includes a ROM (flash ROM) in which the program stored therein can be rewritten. The program of the CPU 200 is written in by the serial communication means 203, so that the transistor 204 of the output voltage adjustment circuitry 250 is switched on or off so as to change the intermediate voltage of the connecting point 103, and in a case of an engine control device having a limited terminal and not having a non-used terminal A, screening of the integrated circuits 112, 113 after mounting can be performed.

Furthermore, in the engine control device 107 of the third embodiment, the CPU 300 includes the control program to mutually switch a program to set the output of the port 309 of the CPU 300 to a low level or a high level according to the output signal from the serial communication means 203. The programs of the CPU 300 are switched by the serial communication means 203, whereby, the transistor 204 of the output voltage adjustment circuitry 303 is switched on or off and the intermediate voltage of the connecting point 103 cannot be changed; and if the engine control device does not have an unused terminal A and the CPU does not have the flash ROM, screening of the integrated circuit 112, 113 after mounting can still be performed.

Although the embodiment of the present invention is explained in detail as above, the present invention is not limited to the above embodiments. Various kinds of modification are possible in design without deviating from the present invention mentioned in the claims.

For example, in the first embodiment, the output voltage adjustment circuitry is divided into the engine control device and the check equipment; however, this circuitry may be provided as one body in the engine control device.

In addition, the check equipment is not limited to use only for engine control. By providing the output voltage adjustment circuitry and the characteristic check circuit as the control device of the integrated circuit mounted as the bear chip status, the screening of the integrated circuit and the function test can be performed.

As is apparent from the above-mentioned description, the engine control device in the present invention can perform the screening of the semiconductor integrated circuit mounted as a bare chip form on the circuit board, by arranging the output voltage adjustment circuit, and reduction of the mounting area size and improvement of the electrical characteristic nature becomes possible and reduction of the manufacturing cost can be planned too by a simple constitution thereof.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An engine control device having screening apparatus for checking for latent defects in integrated circuit elements contained therein, said device comprising:

a voltage source circuit having a reference voltage source for outputting electric power with a rated voltage to an output side power line, based on a comparison of a reference voltage supplied by said reference voltage source with a voltage derived from said electric power;

an integrated circuit for processing engine control information, said integrated circuit being supplied with the electric power through said output side power line;

a first resistor having one end thereof connected to said output side power line;

a second resistor connected between another end of said first resistor and ground; and a series circuit of another resistor connected in parallel to said second resistor via a switch; wherein a voltage higher than said reference voltage is fed to said integrated circuit by varying a ratio of resistance values of said first resistor and said second resistor using said switch, whereby said voltage derived from said electric power is varied, causing said higher voltage to be generated for screening said integrated circuit.

2. An engine control device as defined in claim 1, wherein said switch is a mechanical switch.

3. An engine control device as defined in claim 1, wherein said switch is a semiconductor switch.

* * * * *